(12) United States Patent
Dellinger et al.

(10) Patent No.: US 12,307,217 B1
(45) Date of Patent: May 20, 2025

(54) DYNAMIC ADJUSTMENT OF FLOATING POINT EXPONENT BIAS FOR EXPONENT COMPRESSION

(71) Applicant: Xilinx, Inc., San Jose, CA (US)

(72) Inventors: Eric F. Dellinger, Longmont, CO (US); Philip B. James-Roxby, Longmont, CO (US)

(73) Assignee: XILINX, INC., San Jose, CA (US)

( * ) Notice: Subject to any disclaimer, the term of this patent is extended or adjusted under 35 U.S.C. 154(b) by 1012 days.

(21) Appl. No.: 17/313,224

(22) Filed: May 6, 2021

(51) Int. Cl.
*G06F 7/483* (2006.01)
*G06F 7/499* (2006.01)
*H03M 7/24* (2006.01)
*H03M 7/30* (2006.01)

(52) U.S. Cl.
CPC .......... *G06F 7/483* (2013.01); *G06F 7/49942* (2013.01); *H03M 7/24* (2013.01); *H03M 7/30* (2013.01)

(58) Field of Classification Search
CPC ........ H03M 7/24; H03M 7/30; H03M 7/3059; G06F 7/483; G06F 7/49942
See application file for complete search history.

(56) References Cited

U.S. PATENT DOCUMENTS

| | | | |
|---|---|---|---|
| 11,387,843 B1 * | 7/2022 | Huang ................ | H03M 7/6005 |
| 2013/0007078 A1 * | 1/2013 | Wegener ................ | H03M 7/30 |
| | | | 708/203 |
| 2020/0225948 A1 * | 7/2020 | Sim ....................... | G06F 9/3802 |

OTHER PUBLICATIONS

Thierry Tambe et al., "AdaptivFloat: A Floating-Point Based Data Type For Resilient Deep Learning Inference", arXiv:1909.13271v3 [cs.LG] , Feb. 11, 2020.
Xiao Sun et al., "Hybrid 8-bit Floating Point (HFP8) Training and Inference for Deep Neural Networks", 33rd Conference on Neural Information Processing Systems (NeurIPS 2019), Vancouver, Canada.
U.S. Appl. No. 17/171,608, filed Feb. 9, 2021, entitled: "Lossless Compression Using Subnormal Floating Point Values". The Examiner is referred to the copending patent prosecution of the common Applicant (no attachment).

* cited by examiner

*Primary Examiner* — Matthew D Sandifer
(74) *Attorney, Agent, or Firm* — Patterson + Sheridan, LLP

(57) ABSTRACT

Approaches for compressing exponents of floating point values include accumulating a distribution of values of exponents of the first set of floating point values, and compressing the exponents of the first set of floating point values into a compressed exponent bit-width as a function of a compressed exponent bias. The compressed exponent bit-width and the compressed exponent bias are adjusted based on the distribution of values of exponents of the first set of floating point values. The distribution of values of exponents of the first set of floating point values is accumulated with values of exponents of a second set of floating point values that is input in subsequent time period. The exponents of second set of floating point values are compressed into the compressed exponent bit-width as a function of the compressed exponent bias after the adjusting of the compressed exponent bit-width and the compressed exponent bias.

20 Claims, 9 Drawing Sheets

| Uncompressed Exponent original bias, $B_O$ = 127 | | | Compressed Exponent adjusted bias, $B_A$ = 22 bias adjustment factor (BAF) = 127 - 22 = 105 | |
|---|---|---|---|---|
| $E_2$ | $E_{10}$ | $E_b$ | $E_{10}$ - BAF | $E_2$ |
| 0000 0001 | 1 | $2^{-126}$ | | |
| 0000 0010 | 2 | $2^{-125}$ | | |
| 0000 0011 | 3 | $2^{-124}$ | | |
| ... | ... | ... | | |
| 0110 1010 | 106 | $2^{-21}$ | | |
| 0110 1011 | 107 | $2^{-20}$ | 1 | 0001 |
| 0110 1100 | 108 | $2^{-19}$ | 2 | 0010 |
| ... | ... | ... | 3 | 0011 |
| 0111 0111 | 119 | $2^{-8}$ | ... | ... |
| 0111 1000 | 120 | $2^{-7}$ | 14 | 1110 |
| ... | ... | ... | 15 | 1111 |
| 0111 1111 | 127 | $2^{0}$ | | |
| 1000 0000 | 128 | $2^{1}$ | | |
| 1000 0001 | 129 | $2^{2}$ | | |
| ... | ... | ... | | |
| 0111 1100 | 252 | $2^{125}$ | | |
| 1111 1101 | 253 | $2^{126}$ | | |
| 1111 1110 | 254 | $2^{127}$ | | |

FIG. 10

DYNAMIC ADJUSTMENT OF FLOATING POINT EXPONENT BIAS FOR EXPONENT COMPRESSION

TECHNICAL FIELD

The disclosure generally relates to data compression.

BACKGROUND

Processing of floating point values presents a tradeoff between application accuracy and performance. Performance can be improved at the expense of accuracy by reducing the number of mantissa bits and thereby the precision of floating point values. Accuracy can be maintained at the expense of performance by maintaining full precision of floating point values in a data set. However, the greater precision increases memory and computation requirements.

Some applications can tolerate some reduction in precision without significantly reducing the accuracy of final results. For example, training a neural network is a stochastic process that can tolerate some noise in the data. This allows a reduction in the precision of floating point values in the training tensors without significantly reducing accuracy of the results. However, every application will have some threshold below which floating point precision cannot be reduced without producing erroneous results.

SUMMARY

A disclosed method includes inputting a first set and a second set of floating point values over a first time period and a subsequent second time period, respectively. The method includes accumulating a distribution of values of exponents of the first set of floating point values by a statistics circuit, and compressing the exponents of the first set of floating point values by a compression circuit into a compressed exponent bit-width as a function of a compressed exponent bias. The method includes adjusting the compressed exponent bit-width and the compressed exponent bias by a bias adjustment circuit based on the distribution of values of exponents of the first set of floating point values, and accumulating the distribution of values of exponents of the first set of floating point values with values of exponents of the second set of floating point values by the statistics circuit. The method includes compressing, after the adjusting of the compressed exponent bit-width and the compressed exponent bias, the exponents of second set of floating point values into the compressed exponent bit-width by the compression circuit as a function of the compressed exponent bias.

A disclosed circuit arrangement includes a first circuit configured to compress exponents of an input set of floating point values into a compressed exponent bit-width as a function of a compressed exponent bias. The circuit arrangement includes a second circuit configured to accumulate a mean and a standard deviation of exponent values of exponents of the floating point values in the set of floating point values, in parallel with compression of the exponents. The circuit arrangement includes a processor circuit configured to adjust the compressed exponent bit-width and the compressed exponent bias as a function of the mean and the standard deviation, and to provide the compressed exponent bias as a function of the mean and the standard deviation to the first circuit after adjustment.

A disclosed system includes a tensor processor and a compression circuit coupled to the tensor processor. The compression circuit is configured to compress a set of floating point values generated by the tensor processor into a compressed set of floating point values having exponent values of a compressed exponent bit-width and based on a compressed exponent bias. The system includes a collator circuit coupled to the compression circuit and configured to accumulate a mean and a standard deviation of exponent values of the exponents of floating point values in the set of floating point values from the tensor processor, in parallel with compression of the exponents. The system includes a memory coupled to the compression circuit and configured to store the compressed set of floating point values from the compression circuit. The system includes a processor circuit coupled to the collator circuit and configured to adjust the compressed exponent bit-width and the compressed exponent bias as a function of the mean and the standard deviation, and to provide the compressed exponent bias as a function of the mean and the standard deviation to the compression circuit after adjustment. The system includes a decompression circuit coupled to the memory and to the tensor processor. The decompression circuit is configured to decompress the compressed set of floating point values from the memory into an expanded set of floating point values by expanding exponents of the compressed set of floating point values into exponents of an expanded bit-width and based on an expanded exponent bias, and to provide the expanded set of floating point values to the tensor processor.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which:

FIG. 10 shows an example of a mapping of uncompressed exponents to compressed exponents.

DETAILED DESCRIPTION

Figure 1:
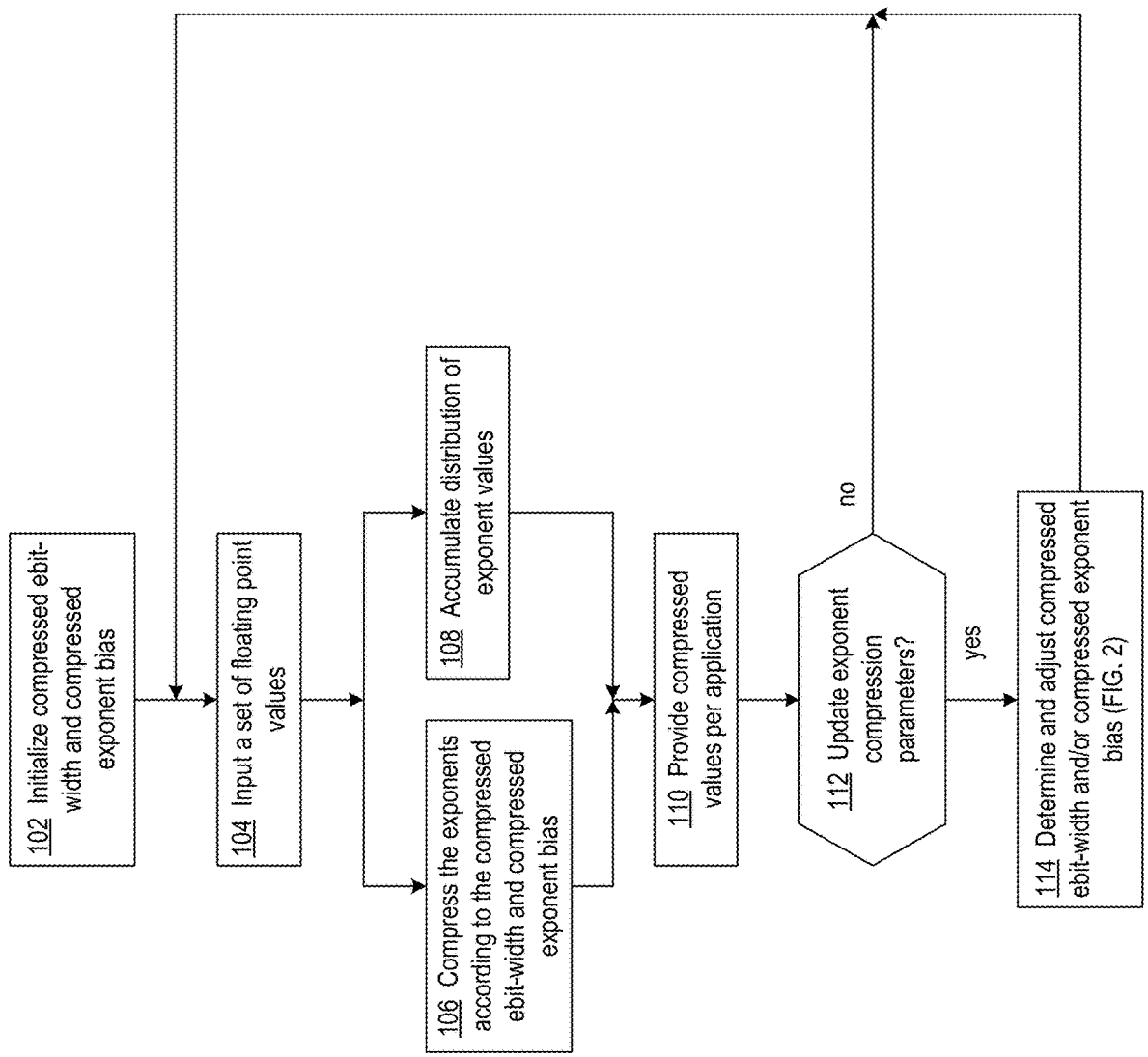
FIG. 1 shows a flowchart of an exemplary process for adaptively compressing exponents of floating point values.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

According to the disclosed approaches, exponents of floating point values can be compressed into a reduced number of bits, and the exponent bias can be adjusted to accommodate a changing range of exponent values encountered during application runtime. Ascertaining the full range of exponent values for all data to be processed in an application run can be burdensome in some applications. For example, neural network training involves numerous input tensors, weight tensors, output tensors etc. Each tensor can have a different range of exponent values of the tensor elements, and the exponents of elements in some tensors may not be known until run-time.

FIG. 1 shows a flowchart of an exemplary process for adaptively compressing exponents of floating point values. The process of FIG. 1 is described in terms of compressing the exponent in a set(s) of floating point values according to current exponent compression parameters, and updating the exponent compression parameters at selected times for compressing the exponents in subsequent sets of floating point values. The exponent compression parameters include the number of bits in a compressed exponent ("compressed ebit-width") and the exponent bias ("compressed exponent bias") associated with the compressed exponent.

Depending on the application, the sets of floating point values could be successive blocks of data such as in a streaming application, or different instances of the same tensor encountered during training of a neural network, for example. Unrelated sets of floating point values can have different compressed ebit-widths and compressed exponent biases according to the disclosed approaches. Unrelated sets of floating point values can be sets in which the ranges of exponents are widely divergent relative to one another, and using the same compressed ebit-width and compressed exponent bias is unfeasible for a desired bit width.

At block 102, initial values are established for compressed ebit-width and the compressed exponent bias. The initial values can be estimations that encompass a wider range of exponent values and bias than may be eventually found to be suitable for the application. Alternatively, in a neural network training application, some number of batches could be run without compression, and distribution statistics gathered per block 108 and initial values determined per block 114.

At block 104, a set of floating point values (having uncompressed exponents) is input. The processing of blocks 106 and 108 can proceed in parallel. At block 106, the exponents are compressed according to the current compressed ebit-width and current compressed exponent bias associated with the set. At block 108, the distribution of exponent values is accumulated. The distribution can be cumulative of multiple sets of floating point values. The distribution can record the minimum exponent value ("minexp"), the maximum exponent value ("maxexp"), a sum of exponent values, and a sum of squared differences between each exponent value and a previously calculated mean. Note that for an initial set of floating point values, the midpoint of an estimated range of exponents can be used as the "previously calculated mean." The distribution can be used at a designated time to adjust the compressed exponent bias and optionally, the compressed ebit-width.

The set of floating point values having the compressed exponents is provided at block 110 for additional processing according to the application. For example, the additional processing can entail storing the set of floating point values having the compressed exponents in a memory for later decompressing and processing by a tensor processor, or inputting the set of floating point values having the compressed exponents directly to a processor that is configured to process floating point values having the compressed exponents. Floating point values having compressed exponents require less memory and bandwidth than to floating point values having full width exponents, and performing arithmetic operations on floating point values having compressed exponents requires fewer circuit resources than performing those arithmetic operations on floating point values having full width exponents.

Decision block 112 controls the timing of adjustments to the exponent compression parameters. For example, the parameters can be adjusted after accumulating the distribution of exponent values for some number of sets of floating point values. The process returns to block 104 to input another set of floating point values if the time for updating the exponent compression parameters has not been reached.

At block 114, the exponent compression parameters are adjusted based on the distribution of exponents accumulated at block 108. From the accumulated distribution, a new current mean and standard deviation are calculated, and the new mean and standard deviation can be used to adjust the compressed exponent bias and optionally, the compressed ebit-width.

Figure 2:
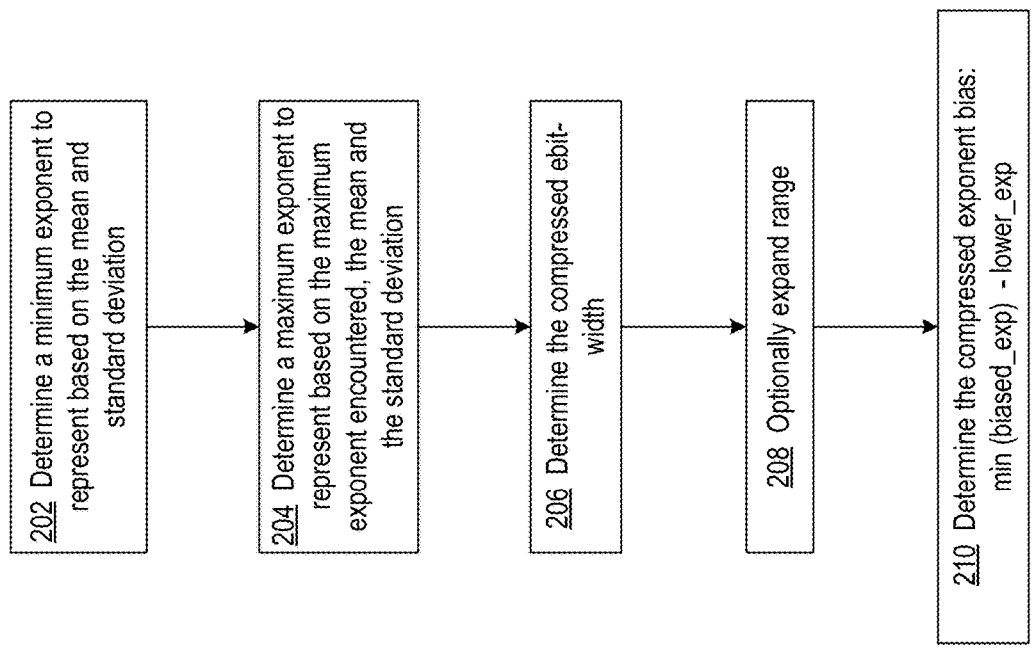
FIG. 2 shows a flowchart of an exemplary process for determining a compressed ebit-width and a compressed exponent bias based on a distribution of exponent values.

FIG. 2 shows a flowchart of an exemplary process for determining a compressed ebit-width and a compressed exponent bias based on a distribution of exponent values. The compressed ebit-width and compressed exponent bias cover a smaller range of exponents than the ranges of uncompressed exponents. The reduced ranges has a lower bound and an upper bound, referenced as "lower_exp" and "upper_exp," respectively.

At block 202, the lower_exp can be determined based on the mean and the standard deviation of the distribution. The minimum exponent can be computed as ceil (mean−standard_deviation). For example, if the mean exponent is −8.45 and the standard deviation is 3.32, ceil (−8.45−3.32)=−12.

At block 204, the upper_exp can be determined based on the maximum exponent in the distribution ("maxexp"), the mean, and the standard deviation. According to an exemplary approach, upper_exp can be computed as: min(maxexp, floor(mean+1.5*standard_deviation)). Continuing the preceding example with maxexp=−1, upper_exp=min (−1, floor(−8.45+1.5*3.32))=−3.

At block 206, the compressed ebit-width is determined. According to one approach, an upper limit can be specified a priori for the number of bits used to represent the compressed exponent ("exp_num_bits"). If the number of bits required to cover the range from lower_exp to upper_exp is greater than exp_num_bits, the lower_exp of the range can be increased to provide complete coverage. If the number of bits required to cover the range from lower_exp to upper_exp is less than exp_num_bits, at block 206, the range can be expanded.

At block 208, the range of exponent values covered by the compressed ebit-width can be expanded to cover a range greater than from minexp to maxexp. Continuing the preceding example, the lower_exp=−12 and the upper_exp=−3, and there are 10 exponent values to represent. The 10 values require 4 exponent bits for representation. The 4 bits can represent 15 biased exponent values plus one reserved biased value of 0. As the range has 10 values and 15 non-reserved values can be represented, the range can be expanded by 5 values. The upper_exp can be increased to a value 1 greater than maxexp to provide a greater exponent value for the next iteration. For example, upper_exp can be increased from −3 to 0, consuming 3 of the 5 extra values. The lower_exp can be reduced by 2 to use the 2 extra exponent values (lower_exp decreases from −12 to −14).

In some applications, overflow and/or underflow of exponents may be acceptable, permitting a lesser compressed ebit-width. If both underflow and overflow of exponents is acceptable, the compressed ebit-width and compressed exponent bias cover a range of exponent values from a value greater than the minimum exponent value in the distribution ("minexp") to a value less than the maximum exponent value in the distribution ("maxexp").

At block 210, the compressed exponent bias is computed as the least, non-zero biased exponent value ($0001_2$) minus the lower_exp (e.g., 1−(−14)=15). The greatest biased exponent value is 15 ($1111_2$), which translates to the represented exponent value of 0 (15-15).

According to one approach, the current compressed ebit-width and current compressed exponent bias are changed only if the newly calculated compressed exponent bias does not deviate too much from the current compressed exponent bias. For example, the current compressed exponent bias is changed to the new exponent bias in response to a difference between the new exponent bias and the current compressed exponent bias being less than a threshold.

Figure 3:
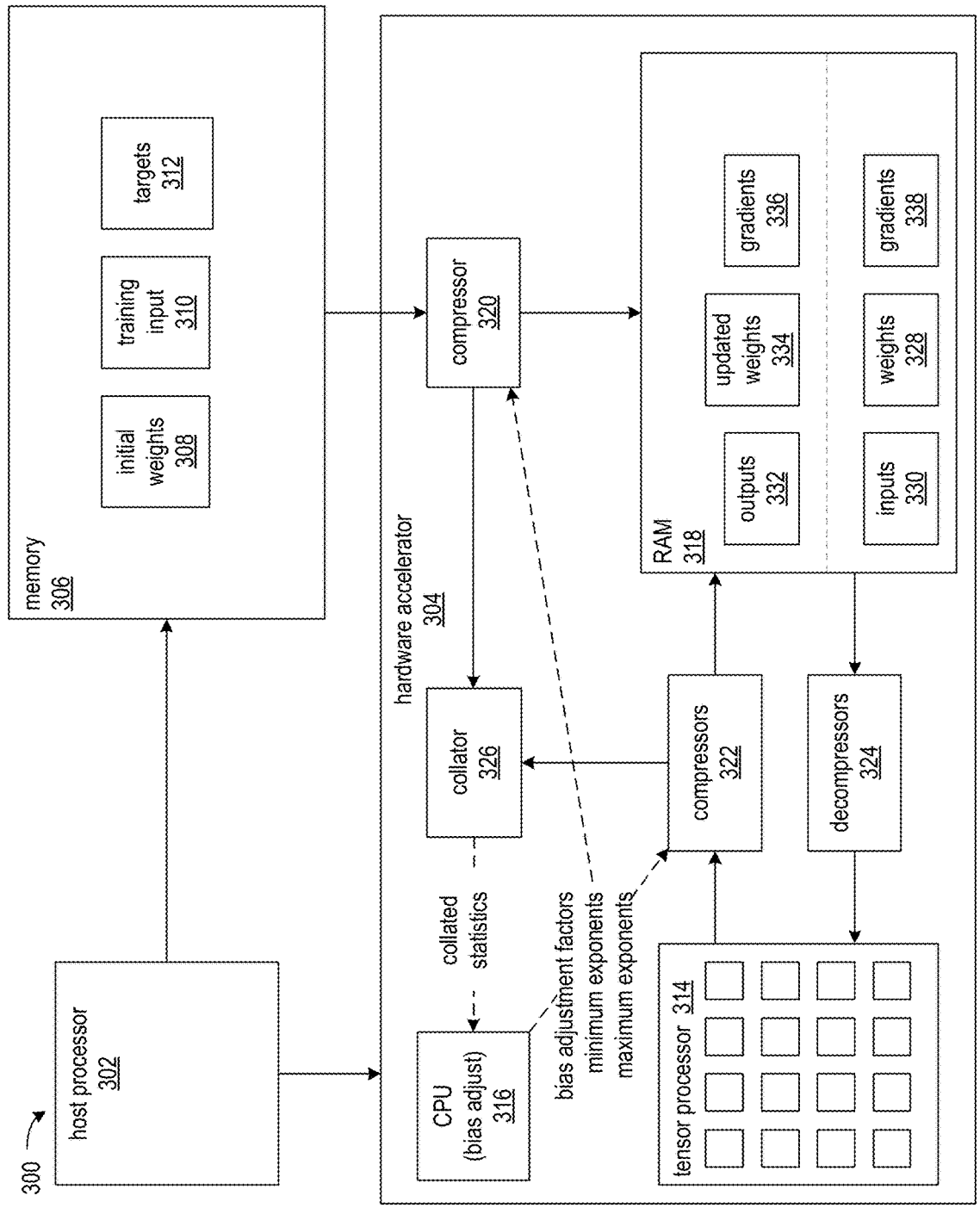
FIG. 3 shows an exemplary system in which the disclosed approaches for compression of exponents can be employed.

FIG. 3 shows an exemplary system 300 in which the disclosed approaches for compression of exponents can be employed. The system 300 can be configured for training a neural network, for example. The system includes a host processor 302, a hardware accelerator 304, and a shared memory 306. The host processor executes a neural network training application and calls upon the hardware accelerator to perform compute intensive tasks during training. For example, the host processor can direct the hardware accelerator to perform convolutions of tensors during forward propagation and backpropagation.

The hardware accelerator 304 can be an adaptive compute acceleration platform (ACAP), such as the VERSAL® system-in-package devices from XILINX, Inc., or a similar device. The host processor 302 and shared memory 306 can be components of a host computer system. The host processor, memory 306, and hardware accelerator can be communicatively coupled via standard control, address, and data buses that provide direct memory access (DMA) to the memory 306.

The hardware accelerator 304 includes a tensor processor 314, a central processing unit (CPU) 316, a RAM 318, compression circuits ("compressors" 320 and 322), decompression circuits ("decompressors" 324), and a collator circuit 326. The compressors compress exponents of tensors and can be circuits implemented in programmable logic of the hardware accelerator. The compression of the exponents reduces storage requirements of RAM 318 and bandwidth requirements for providing reading the tensors from the RAM for processing the tensor processor 314.

The host processor can write tensors of floating point data, such as initial weights 308, training input 310, and targets 312 to the shared memory, and control the hardware accelerator to compute updated weights during training. The initial weights are the values used to begin training, the training input includes the data upon which the training is performed, and the targets include validation data sets. Under control of the host processor 302, the initial weights 308, training input 310, and targets 312 are input to the hardware accelerator, and the compressor 320 compresses the exponents of the floating point values before the tensors are written to the RAM 318. The compressed version of initial weights 308 is shown as weights 328 in the RAM, the compressed version of training input 310 and compressed version of targets 312 are shown as inputs 330.

The exemplary hardware accelerator includes multiple decompressors 324 and multiple compressors 322 for decompressing input to and compressing output from the tensor processor 314. The tensor processor includes an array of artificial intelligence engines ("AI engines"), and each AI engine has a dedicated instruction memory, a RAM for workspace, a RISC scalar processor, a floating point vector processor, and various support modules. Dedicated ones of the multiple decompressors can decompress exponents of floating point values for input to different groups (e.g., columns) of the AI engines. Similarly, dedicated ones of the compressors can compress exponents of floating point values generated by different groups (e.g., columns) of the AI engines. An additional decompressor can be configured to handles weights, as the weights are broadcast across all columns.

The array of AI engines can be configured to perform operations associated with neural network training. For example, the AI engines of the array can be configured to convolve an input tensor and a weight tensor. That is, all the AI engines of the array can be involved in computing the convolution and generating an output tensor.

The elements of an output tensor computed by the tensor processor 314 are generated in parallel by the AI engines of the array. The compressors 322 operate in parallel to compress the exponents of the floating point values of the tensor. The output tensors generated by the tensor processor during training and having the compressed exponents are collectively illustrated as outputs 332 in the RAM 318. Tensors of loss gradients and weight gradients computed during training by the tensor processor and having compressed exponents are shown as gradients 336 and 338 in the RAM. Tensors of updated weights computed during training by the tensor processor and having compressed exponents are shown as updated weights 334 in the RAM.

As the compressors 320 and 322 are compressing exponents of a tensor using current exponent compression parameters associated with that tensor, exponent distribution statistics are collected for the exponents in the tensor undergoing compression. Calculation of the new exponent compression parameters can be performed after compression of the tensor and the gathering of the statistics is complete for that tensor. The new exponent compression parameters are used the next time that tensor (another instance) is compressed. The logic that captures the minimum exponent, maximum exponent, the sum of exponents, and the sum of squared differences between each exponent and previous mean, can be part of each of the compressors or shared by a group of compressors as a separate entity.

The collator 326 can input the minimum exponent value, maximum exponent value, sum of exponents, and sum of squared differences from each compressor (or the values collected for a group of compressors). The collator determines the minimum exponent value and maximum exponent value of floating point values in the tensor, along with the mean of the exponents of all the floating point values in the tensor based on the sum of the exponents of all the floating point values in the tensor. The collator also computes the standard deviation of the values of the exponents using the input sums of sum of squared differences.

The CPU 316 is configured to operate as a bias adjustment circuit and inputs the statistics generated by the collator 326 and computes a new compressed exponent bias and optionally, a new compressed ebit-width for the tensor. Based on the new compressed exponent bias, the CPU 316 computes a "bias adjustment factor" for the tensor. The bias adjustment factor=(original bias−compressed ebit-width), and can be used by the compressors and decompressors to quickly convert between the full exponent representation and the compressed exponent representation. The minimum exponent value, maximum exponent value, and bias adjustment factor are communicated from the CPU to the compressors 320 and 322 so that the compressors can use the updated compressed ebit-width and updated compressed exponent bias the next time the tensor is encountered. The decompressors 324 need only the bias adjustment factor associated with the tensor to decompress compressed exponents of the tensor.

The values of the compressed ebit-width and compressed exponent bias can be stored in association with identifiers of particular tensors. Each tensor involved in the training of the neural network can have a compressed exponent bit-width and a compressed exponent bias that are specific to that tensor.

Though the compressors 320 and 322, decompressors 324, and collator 326 are described as circuits implemented in programmable logic, the functions of the circuits can be alternatively implemented by programmed processors. Similarly, though the bias adjustment function is described as being implemented by programmed CPU 316, the bias adjustment logic could be implemented in programmable logic.

Figure 4:
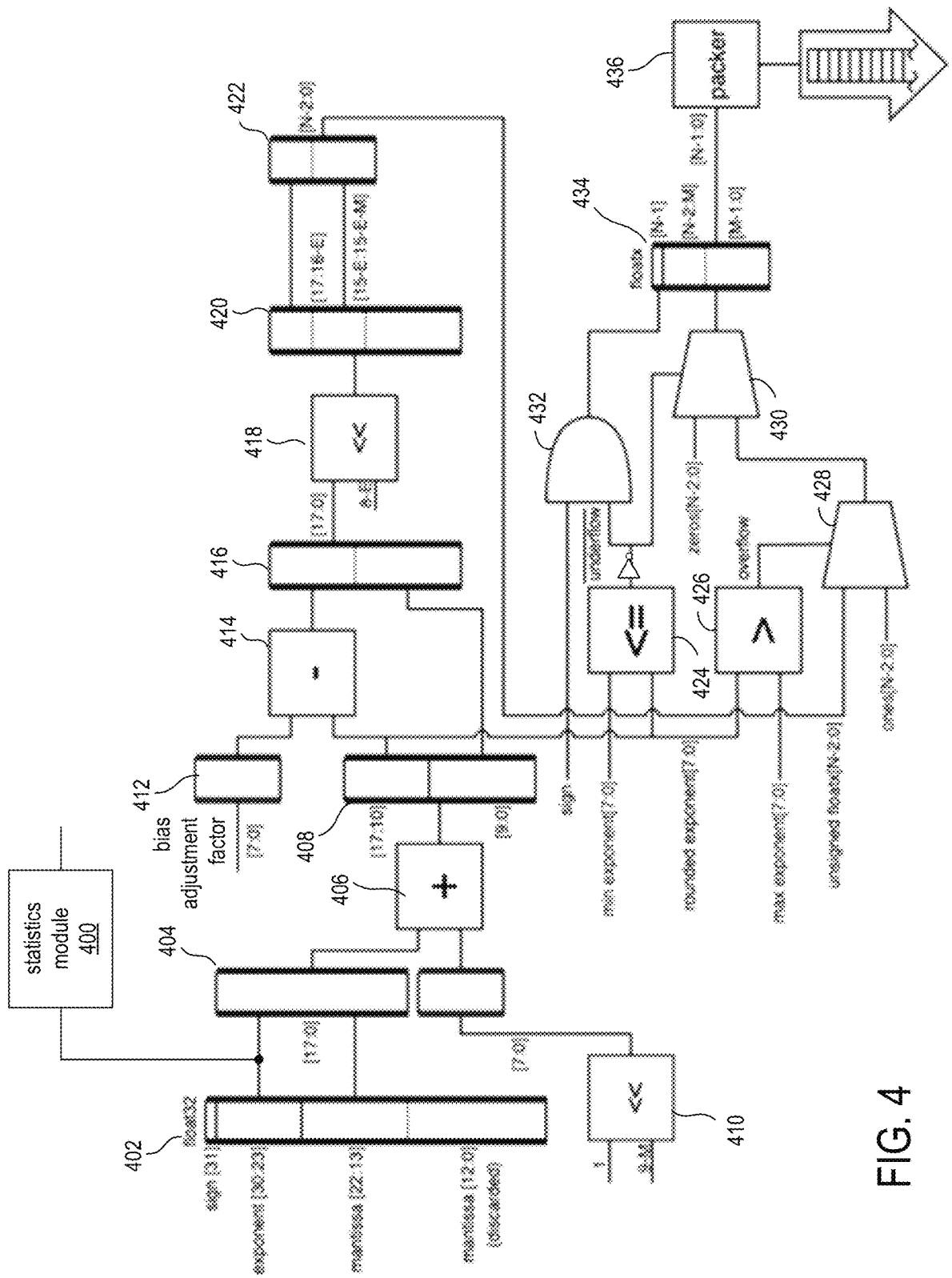
FIG. 4 shows an exemplary compression circuit (or "compressor")
Figure 7:
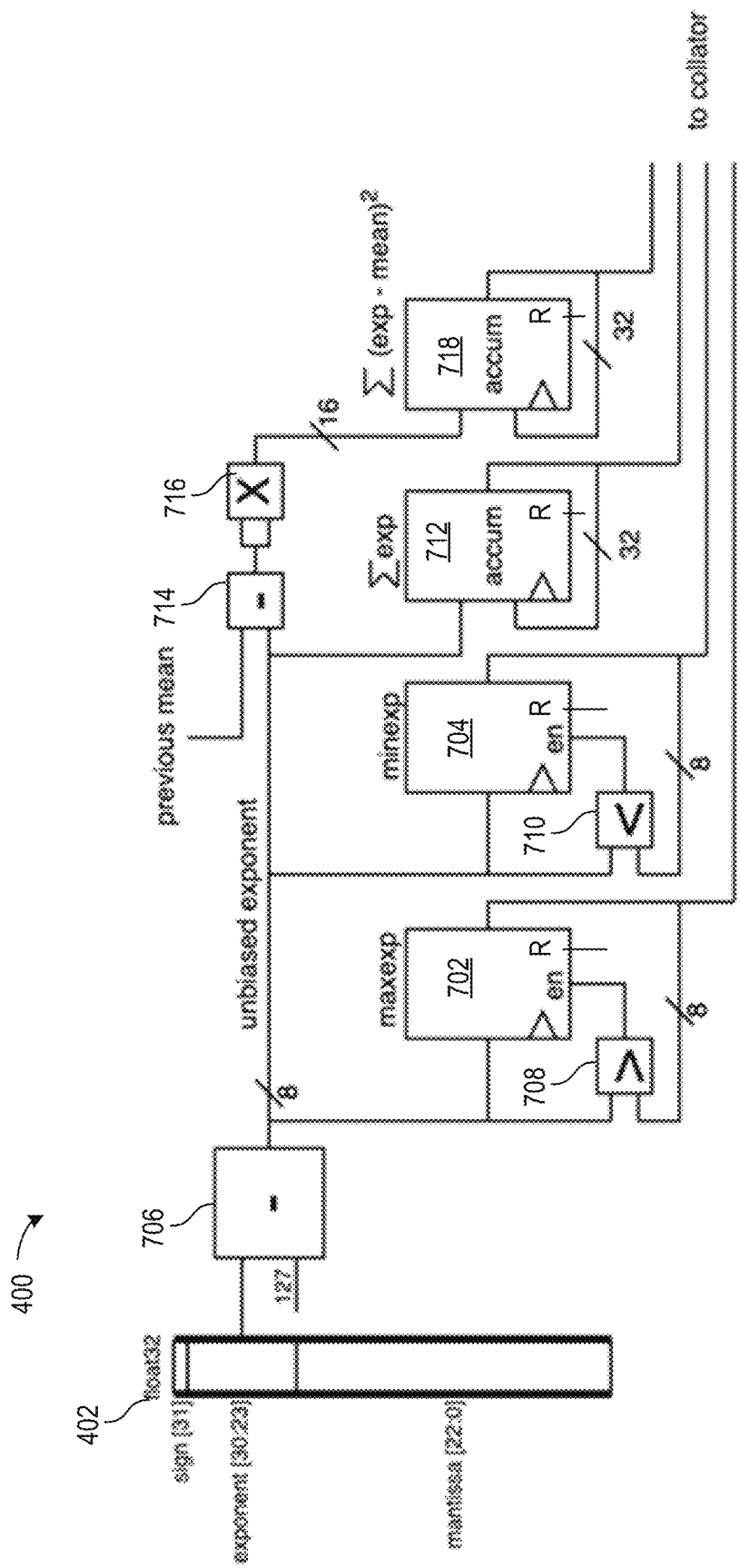
FIG. 7 show an exemplary statistics gatherer circuit.

FIG. 4 shows an exemplary compression circuit (or "compressor"). The compressor can include a statistics circuit 400, for which additional details are shown in FIG. 7. N is the bit-width of the compressed floating point value, E is the compressed ebit-width, and M is the mantissa bit-width (N=1+E+M). For ease of explanation, N=10, E=4, M=5 in the exemplary compressor.

The statistics circuit 400 inputs the exponent bits of a floating point tensor element from register 302. The statistics circuit is configured to determine the minimum exponent value, maximum exponent value, sum of exponent values, and sum of squared differences between each exponent and a previously computed mean of exponents, according to an exemplary implementation.

A floating point value having an uncompressed exponent is input to register 402. In order to reduce hardware costs, the compressor can be limited to compressing a total of 18 bits (not counting the sign bit) of a 32-bit input floating point value. Ten of the 18 bits are mantissa bits. For a 32-bit floating point value having 23 mantissa bits input at register 402, the lower 13 bits (of the mantissa) can be discarded. The sign bit is used in the underflow/overflow section, and the 8-bit exponent and most-significant 10 bits of the mantissa are selected as an 18-bit vector 404.

The value of the 18 bits of the vector 404 is rounded by adder 406 and the rounded value stored in register 408. The rounding involves adding a value having a one bit, one bit beyond the $M^{th}$ bit of precision to the value of vector 404. The rounding amounts to rounding up if the $M^{th}$+1 bit of precision of the mantissa bits of the vector is a one bit, and rounding down (truncate) if the $M^{th}$+1 bit of precision of the mantissa bits of the vector is a zero bit.

The value added to the vector can be constructed as follows in the example involving M=5, and the vector having 8 exponent bits and 10 mantissa bits. Since M=5, the bit in the sixth bit of precision is 1 in the value to add to the vector. Relative to the 18-bit vector, the $14^{th}$ bit from the left (8+M+1, the $14^{th}$ bit of precision) is bit 4 (bit 0 is the least significant bit), which is a 1 shifted to bit 4, such as by left-shift circuit 410. Alternatively, the value can be stored in a reconfigurable register. The number of bit positions shifted is determined by the number of bits of the vector, the number of exponent bits in the vector, and one less than M. That is, the number of bit shifts is 18−8−M−1=9−M=4. For M>0, value can be an 8-bit value, such as 00010000 in this example.

The exponent bits of the vector are used in the rounding, because if all of the M+1 most significant bits of the mantissa are 1, then adding the round will carry over into the exponent. This potentially "rounded" exponent is used for overflow/underflow detection, as well as being converted to the compressed exponent, by subtracting the bias adjustment factor in register 412 from the 8 exponent bits in register 408 by subtractor circuit 414. The bias adjustment factor is a sum of the uncompressed exponent bias (e.g., float 32 bias of 127) from register 412 and the compressed exponent bias, and can be computed and dynamically changed. The compressed and biased exponent is stored in the bottom M bits of the 8 exponent bits in 18-bit working register 416.

The compressed and biased exponent and rounded mantissa in working register 416 are converted into a compressed format by circuitry shown as shift circuit 418, which can include multiplexing circuitry. The exponent bits in working register 416 are effectively shifted by (8−E) bit positions, and the mantissa bits in working register 416 are also effectively shifted by (8−E) bit positions. The shift value, (8−E), can be a stored value.

The result of the shifted bits of the exponent and mantissa is illustrated by block 420, with bits [17:(16−E)] or the 18-bit vector having the compressed and biased exponent, and bits [(15−E):(15−E−M)] of the 18-bit vector having the rounded exponent bits. The shifted exponent bits and mantissa bits are stored in register 422 having (N−1) bits (N−1=M+E).

Circuits 424 and 426 are configured to detect underflow and overflow, and circuits 428, 430, and 432 are configured to properly format the compressed value into register 434 based on detecting or not detecting overflow or underflow conditions. Circuit 424 is configured to detect underflow of the rounded exponent from register 408 relative to a minimum exponent value. Circuit 426 is configured to detect overflow of the rounded exponent from register 408 relative to a maximum exponent value. The minimum exponent value and maximum exponent values are static for the current compressed exponent bias and compressed ebit-width. As the compressed exponent bias and compressed ebit-width can change, new minimum and maximum exponent values can be programmed into control registers.

An underflow condition is signaled by circuit 424 in response to the rounded exponent value from register 408 being less than or equal to the minimum exponent value. An overflow condition is signaled by circuit 426 in response to the rounded exponent value from register 408 being greater than the maximum exponent value.

The selection circuit 428 selects the bits from register 422 in response to circuit 426 signaling no overflow or selects (N−1) 1 bits in response to circuit 426 signaling overflow. The bits selected by circuit 428 are provided as one set of input bits to selection circuit 430. The other set of bits input to selection circuit 430 are (N−1) 0 bits. The selection circuit 430 selects the bits from selection circuit 428 in response to circuit 424 signaling no underflow, or selects (N−1) 0 bits in response to circuit 324 signaling underflow. The selection circuit 430 provides the selected bits to register 434.

AND gate 432 provides the value of the sign bit to the register 434. If the sign bit from register 402 is 0, or if circuit 424 signals underflow, the bit value 0 is stored in register 434. Otherwise, if both the sign bit from register 402 is 1 and circuit 424 do not signal underflow, the bit value 1 is stored in register 434.

The packer circuit 436 assembles groups of multiple compressed values into standard word lengths for efficient communication. For example, for N=10, 6, 10-bit values can be communicated in a 64-bit word.

Figure 5:
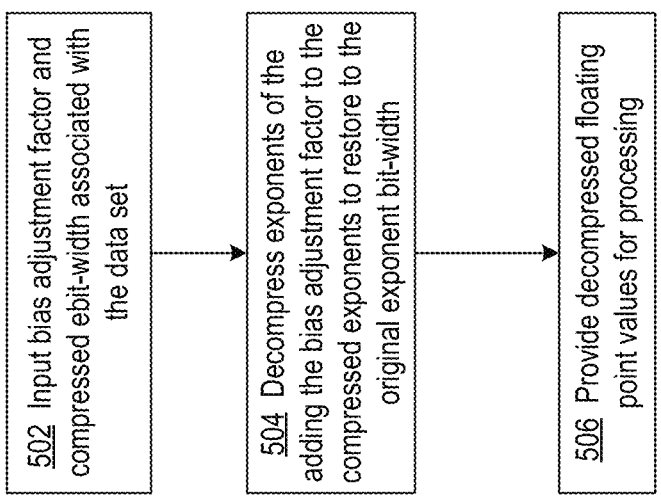
FIG. 5 shows a flowchart of an exemplary process of decompressing exponents of elements of a data set.

FIG. 5 shows a flowchart of an exemplary process of decompressing exponents of elements of a data set.

At block 502, the bias adjustment factor and the compressed ebit-width associated with the data set (e.g., tensor) are input.

At block 504, the exponents are decompressed by adding the bias adjustment factor to the values of the compressed exponents, and storing the exponents in the uncompressed exponent bit-width.

At block 506, the decompressed floating point values can be provided for application processing.

Figure 6:
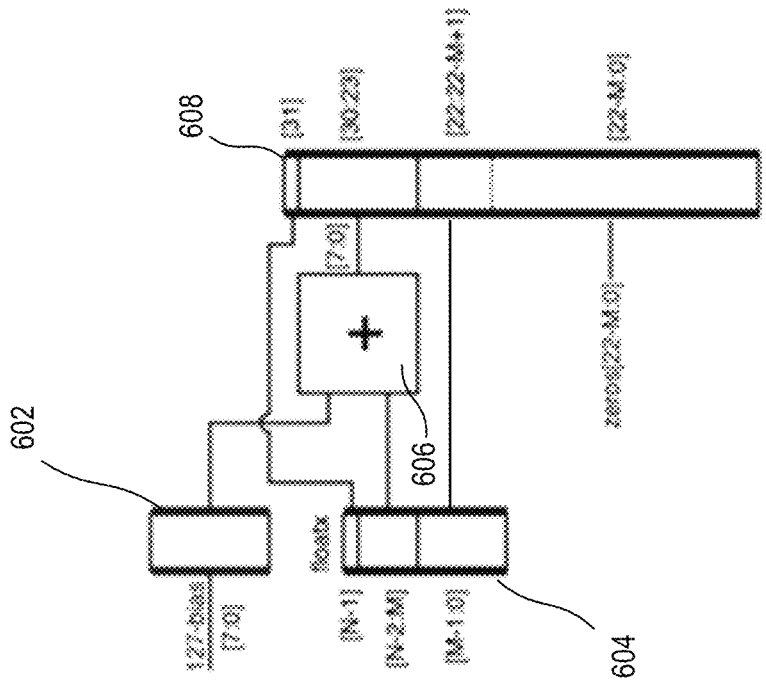
FIG. 6 shows an exemplary decompression circuit (or "decompressor")

FIG. 6 shows an exemplary decompression circuit (or "decompressor"). The bias adjustment factor in register 602 is added to the exponent bits of the compressed value in register 604 by adder circuit 606. The resulting expanded exponent is stored in the bits [30:23] of register 608 reserved for the exponent.

The mantissa in bits [M−1:0] in register 604 are moved to bits [22:22−M+1] of the register 608, which are the high-order M bits of the mantissa. The sign bit from register 604 is moved to bit [31] of the register 508.

FIG. 7 show an exemplary statistics circuit 400. The statistics circuit inputs the exponent bits from an input tensor element in register 402. The statistics circuit is configured to determine the maximum exponent value, minimum exponent value, summation of exponent values, and summation of the squared differences between each exponent and a previously computed mean of exponents, according to an exemplary implementation.

Initialization logic (not shown) can initialize the maxexp register 702 to the maximum possible exponent value (e.g., 127) and initialize the minexp register 704 to the minimum possible exponent value (e.g., −128). The registers 702 and 704 can be 8-bit registers according to an exemplary implementation and can be reinitialized with each new (different) data set.

The uncompressed exponent is input to subtraction circuit 706, and original bias (127) is subtracted from the uncompressed exponent, which results in the value of the unbiased exponent. The comparator circuit 708 compares the unbiased exponent to the current value in the maxexp register 702 and enables storage of the unbiased exponent in response to the value of the unbiased exponent being greater than the current value in register 702. Similarly, comparator circuit 710 compares the unbiased exponent to the current value in the minexp register 704 and enables storage of the unbiased exponent in response to the value of the unbiased exponent being less than the current value in register 704.

The accumulator circuit 712 sums the values of the exponents. Initialization logic (not shown) can initialize the accumulated sum to 0 with each new (different) data set.

The statistics circuit accumulates the sum of squared differences between each exponent and the previously computed mean. The subtraction circuit 714 subtracts the unbiased exponent from the previous mean, and multiplication circuit 716 squares the difference. The output value from the multiplication circuit 716 is input to the accumulation circuit 718. The values from the maxexp register 702, minexp register 704, accumulator 712, and accumulator 718 are provided as input to the collator circuit 326.

Figure 8:
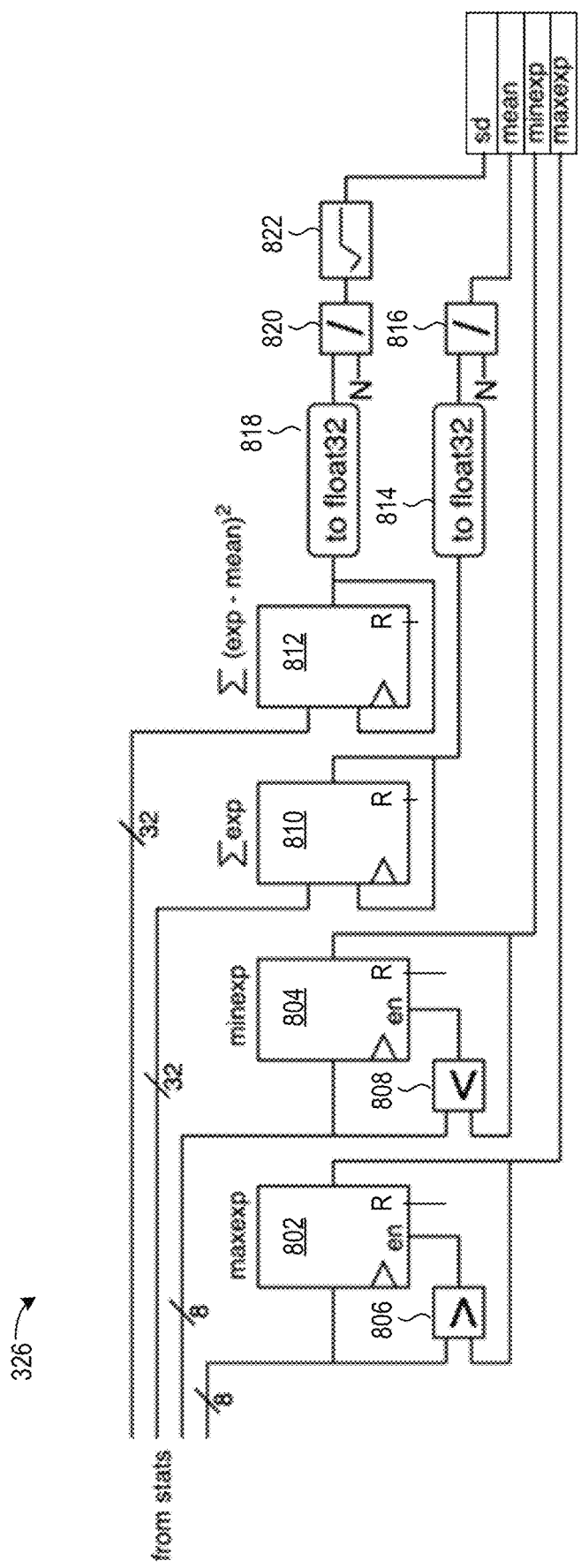
FIG. 8 shows an exemplary collator circuit.

FIG. 8 shows an exemplary collator circuit 326. The collator circuit 326 inputs values of the maximum exponent, minimum exponent, sum of exponents, and sum of squared differences from multiple instances of the statistics circuit 400.

Initialization logic (not shown) can initialize the maxexp register 802 to the maximum possible exponent value (e.g., 127) and initialize the minexp register 804 to the minimum possible exponent value (e.g., −128). The registers 802 and 804 can be 8-bit registers according to an exemplary implementation and can be reinitialized with each new (different) data set.

As values of the maximum exponent, minimum exponent, sum of exponents, and sum of squared differences are input from multiple instances of the statistics circuit 400, the collator circuit 326 can include pre-processing circuitry (not shown) that determines the greatest of the maximum exponents, the least of the minimum exponents, the sum of the sums of exponents, and the sum of the sums of squared differences. These values are input to the comparator circuit 806, comparator circuit 808, accumulator circuit 810, and accumulator circuit 812.

The comparator circuit 806 compares the unbiased exponent to the current value in the maxexp register 802 and enables storage of the new maximum exponent value in response to the value of the input exponent being greater than the current value in register 802. Similarly, comparator circuit 808 compares the unbiased exponent to the current value in the minexp register 804 and enables storage of the input value in response to the value of the input value being less than the current value in register 804.

The accumulator circuit 810 sums the current accumulated sum of exponents with the accumulated sums from the instances of the statistics gatherer circuit. Initialization logic (not shown) can initialize the accumulated sum to 0 with each new (different) data set.

The accumulator circuit 812 accumulates the current sum of squared differences with the accumulated sums of squared differences from the instances of the statistics gatherer circuit. Initialization logic (not shown) can initialize the accumulated sum to 0 with each new (different) data set.

Conversion circuit 814 converts the sum of exponents to floating point format, and division circuit 816 divides the floating point-format sum of exponents by the number of exponents (N) over which the sum was accumulated to generate the mean.

Conversion circuit 818 converts the sum of squared differences to floating point format, and division circuit 820 divides the floating point-format sum of differences by the number of exponents (N). The floating point-format sum of differences is input to circuit 822, which determines the square root of the floating point-format sum of differences and outputs the result as the standard deviation.

Figure 9:
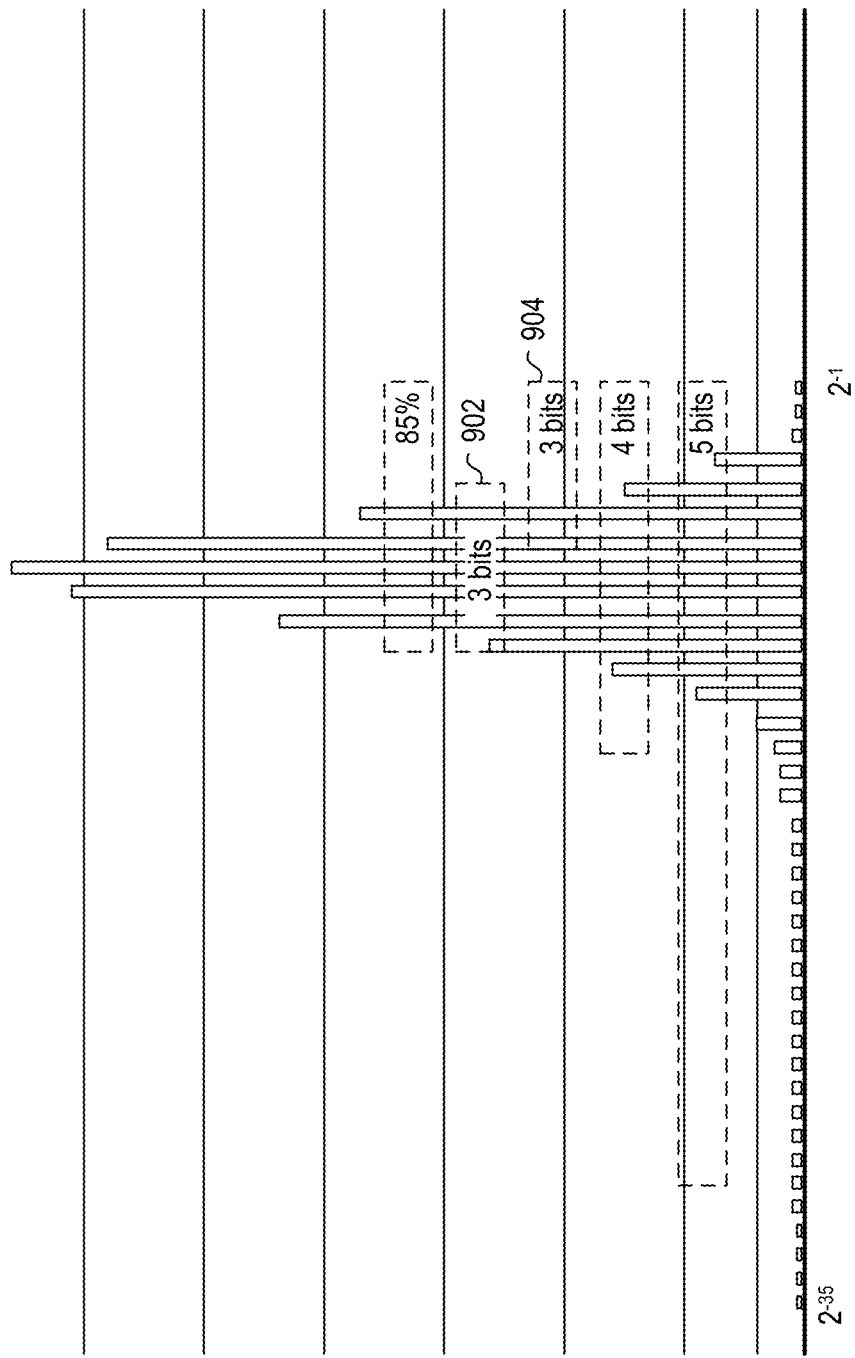
FIG. 9 shows an example of a distribution of exponents of tensor elements for a particular tensor.

FIG. 9 shows an example of a distribution of exponents of tensor elements for a particular tensor. The distribution is from exponent values of $2^{-35}$ to $2^{-1}$, based on original bias of −127, for example. Each vertical bar represents a number of exponents of a particular value encountered in an output tensor during training of a neural network. The dashed-line boxes illustrate coverage of the exponent values by different combinations of a reduced exponent bias and reduced exponent bit-width. A greater or lesser number of exponents for a particular tensor can be represented by the same number of exponent bits, depending on the selected bias. For example, blocks 902 and 904 both exemplify 3-bit exponents. However, the bias associated with block 902 shows a greater coverage of exponents than does the bias associated with block 904. The disclosed approaches provides methods and systems for selection and adjustment of suitable exponent biases and bit-widths for different tensors generated during neural network training.

FIG. 10 shows an example of a mapping of uncompressed exponents to compressed exponents. The first three columns in the table show exponent values based on an exponent bias, $B_O$, of 127 for uncompressed exponents. The $E_2$ column shows binary values of an 8-bit exponent. The $E_{10}$ column shows the decimal equivalents of the binary values of the 8-bit exponent. The $E_b$ column shows the biased exponent values corresponding to the binary values of the 8-bit exponent.

The last two columns in the table show a mapping of possible values of a 4-bit exponent to a subrange of the biased exponent values, $E_b$. Note that 0000b is reserved. The selected (or "adjusted") bias, $B_A$, is 22, and the bias adjustment factor, $BAF=B_O-B_A$.

The subrange of the biased exponent values, $E_b$, represented by the values of the compressed exponents is from $2^{-21}$ to $2^{-7}$. An uncompressed 8-bit exponent can be compressed into a 4-bit exponent by subtracting the BAF from the 8-bit value. For example, the uncompressed exponent $01111000_2$, ($120_{10}$), can be compressed subtracting the BAF (105) from 120 (120−105=15).

Various logic may be implemented as circuitry to carry out one or more of the operations and activities described herein and/or shown in the figures. In these contexts, a circuit or circuitry may be referred to as "logic," "module," "engine," or "block." It should be understood that logic, modules, engines and blocks are all circuits that carry out one or more of the operations/activities. In certain implementations, a programmable circuit is one or more computer circuits programmed to execute a set (or sets) of instructions stored in a ROM or RAM and/or operate according to configuration data stored in a configuration memory.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for compressing exponents of floating point values. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
    inputting a first set and a second set of floating point values to a computer-implemented application over a first time period and a subsequent second time period, respectively;
    accumulating a distribution of values of exponents of the first set of floating point values by a statistics circuit;
    compressing the exponents of the first set of floating point values by a compression circuit into a compressed exponent bit-width as a function of a compressed exponent bias;
    processing the first set of floating point values having compressed exponents by the application;
    adjusting the compressed exponent bit-width and the compressed exponent bias by a bias adjustment circuit based on the distribution of values of exponents of the first set of floating point values;
    accumulating the distribution of values of exponents of the first set of floating point values with values of exponents of the second set of floating point values by the statistics circuit;
    compressing, after the adjusting of the compressed exponent bit-width and the compressed exponent bias, the exponents of second set of floating point values into the compressed exponent bit-width by the compression circuit as a function of the compressed exponent bias; and
    processing the second set of floating point values having compressed exponents by the application,
    wherein processing floating point values having compressed exponents by the application comprises at least one of performing arithmetic operations by a processor and storing the floating point values having compressed exponents in a memory.

2. The method of claim 1, wherein the accumulating includes determining a minimum exponent value and a maximum exponent value in the first set of floating point values, and further comprising:
    determining values of the compressed exponent bit-width and compressed exponent bias by the bias adjustment circuit to cover a range of exponent values from a value greater than or equal to the minimum exponent value to a value less than or equal to the maximum exponent value.

3. The method of claim 1, wherein the accumulating includes determining a minimum exponent value and a maximum exponent value in the first set of floating point values, and further comprising:
    determining values of the compressed exponent bit-width and compressed exponent bias to cover a range of exponent values from a value less than the minimum exponent value to a value greater than the maximum exponent value.

4. The method of claim 1, wherein:
    the accumulating includes determining a minimum exponent value and a maximum exponent value in the first set of floating point values; and
    the adjusting the compressed exponent bias includes:
        computing a new exponent bias,
        determining a difference between the new exponent bias and the compressed exponent bias, and
        changing the compressed exponent bias to the new exponent bias in response to the difference being less than a threshold.

5. The method of claim 1, wherein processing further comprises:
    providing the first set of floating point values having compressed exponents to the processor for performing arithmetic operations; and
    providing the second set of floating point values having compressed exponents to the processor for performing arithmetic operations.

6. The method of claim 1, wherein processing further comprises:
    storing the first set of floating point values having compressed exponents in the memory; and
    storing the second set of floating point values having compressed exponents in the memory.

7. The method of claim 1, wherein the first set of floating point values is a first instance of a tensor in a layer of a neural network, and the second set of floating point values is a second instance of the tensor.

8. The method of claim 7, further comprising:
storing the first set of floating point values having compressed exponents in a memory;
storing the second set of floating point values having compressed exponents in the memory;
reading the first set of floating point values having compressed exponents from the memory;
decompressing the compressed exponents of the first set of floating point values read from the memory;
providing the first set of floating point values to a tensor processor after the decompressing;
reading the second set of floating point values having compressed exponents from the memory;
decompressing the exponents of the second set of floating point values read from the memory; and
providing the second set of floating point values to the tensor processor after the decompressing.

9. The method of claim 8, wherein:
the accumulating the distribution of values of exponents of the first set of floating point values includes accumulating the distribution of values of exponents of the first set of floating point values that is output from the tensor processor;
the compressing the exponents of the first set of floating point values includes compressing the exponents of the first set of floating point values that is output from the tensor processor; and
the second set of floating point values is output by the tensor processor.

10. The method of claim 1, further comprising:
computing a bias adjustment factor as a difference of an uncompressed exponent bias and the compressed exponent bias; and
storing the bias adjustment factor in a register;
wherein the compressing the exponents of the first set of floating point values includes subtracting the bias adjustment factor from the exponents of the first set of floating point values.

11. A circuit arrangement, comprising:
a first circuit configured to compress exponents of an input set of floating point values to a computer-implemented application into a compressed exponent bit-width as a function of a compressed exponent bias;
a second circuit configured to accumulate a mean and a standard deviation of values of exponents of the floating point values in the set of floating point values, in parallel with compression of the exponents; and
a first processor circuit configured to adjust the compressed exponent bit-width and the compressed exponent bias as a function of the mean and the standard deviation during the application runtime, and to provide the compressed exponent bias as a function of the mean and the standard deviation to the first circuit after adjustment;
wherein the circuit arrangement processes the input set of floating point values having compressed exponents according to the application by performing at least one of:
arithmetic operations on the floating point values having compressed exponents by a second processor, and
storing the floating point values having compressed exponents in a memory.

12. The circuit arrangement of claim 11, wherein the second circuit is configured to:
determine a minimum exponent value and a maximum exponent value in the first set of floating point values; and
determine values of the compressed exponent bit-width and compressed exponent bias to cover a range of exponent values from a value greater than or equal to the minimum exponent value to a value less than or equal to the maximum exponent value.

13. The circuit arrangement of claim 11, wherein the second circuit is configured to:
determine a minimum exponent value and a maximum exponent value in the first set of floating point values; and
determine values of the compressed exponent bit-width and compressed exponent bias to cover a range of exponent values from a value less than the minimum exponent value to a value greater than the maximum exponent value.

14. The circuit arrangement of claim 11, wherein:
the second circuit is configured to determine a minimum exponent value and a maximum exponent value in the first set of floating point values; and
the processor circuit is configured to:
compute a new exponent bias,
determine a difference between the new exponent bias and the compressed exponent bias, and
change the compressed exponent bias to the new exponent bias in response to the difference being less than a threshold.

15. The circuit arrangement of claim 11, wherein:
the first processor circuit is configured to compute a bias adjustment factor as a difference of an uncompressed exponent bias and the compressed exponent bias and store the bias adjustment factor in a register; and
the first circuit is configured to compress the exponents of the first set of floating point values by subtracting the bias adjustment factor from the exponents of the first set of floating point values.

16. A system, comprising:
a tensor processor;
a compression circuit coupled to the tensor processor and configured to compress a set of floating point values generated by the tensor processor into a compressed set of floating point values having exponent values of a compressed exponent bit-width and based on a compressed exponent bias;
a collator circuit coupled to the compression circuit and configured to accumulate a mean and a standard deviation of values of the exponents of floating point values in the set of floating point values from the tensor processor, in parallel with compression of the exponents;
a memory coupled to the compression circuit and configured to store the compressed set of floating point values from the compression circuit;
a processor circuit coupled to the collator circuit and configured to adjust the compressed exponent bit-width and the compressed exponent bias as a function of the mean and the standard deviation, and to provide the compressed exponent bias as a function of the mean and the standard deviation to the compression circuit after adjustment; and
a decompression circuit coupled to the memory and to the tensor processor, the decompression circuit configured to decompress the compressed set of floating point values from the memory into an expanded set of floating point values by expanding exponents of the compressed set of floating point values into exponents of an expanded bit-width and based on an expanded exponent bias, and to provide the expanded set of floating point values to the tensor processor.

17. The system of claim 16, wherein:

the collator circuit is configured to determine a minimum exponent value and a maximum exponent value in the first set of floating point values; and the processor circuit is configured to determine values of the compressed exponent bit-width and compressed exponent bias to cover a range of exponent values from a value greater than or equal to the minimum exponent value to a value less than or equal to the maximum exponent value.

18. The system of claim 16, wherein:

the collator circuit is configured to determine a minimum exponent value and a maximum exponent value in the first set of floating point values; and the processor circuit is configured to determine values of the compressed exponent bit-width and compressed exponent bias to cover a range of exponent values from a value less than the minimum exponent value to a value greater than the maximum exponent value.

19. The system of claim 16, wherein:

the collator circuit is configured to determine a minimum exponent value and a maximum exponent value in the first set of floating point values; and the processor circuit is configured to:
  compute a new exponent bias,
  determine a difference between the new exponent bias and the compressed exponent bias, and
  change the compressed exponent bias to the new exponent bias in response to the difference being less than a threshold.

20. The system of claim 16, wherein:

the processor circuit is configured to compute a bias adjustment factor as a difference of an uncompressed exponent bias and the compressed exponent bias and store the bias adjustment factor in a register; and the compression circuit is configured to compress the exponents of the first set of floating point values by subtracting the bias adjustment factor from the exponents of the first set of floating point values.

* * * * *